(12) United States Patent
Carey et al.

(10) Patent No.: US 8,001,411 B2
(45) Date of Patent: Aug. 16, 2011

(54) GENERATING A LOCAL CLOCK DOMAIN USING DYNAMIC CONTROLS

(75) Inventors: Sean Michael Carey, Hyde Park, NY (US); William Vincent Huott, Holmes, NY (US); Christian Jacobi, Poughkeepsie, NY (US); Guenter Mayer, Schoenaich (DE); Timothy Gerard McNamara, Hopewell Junction, NY (US); Chung-Lung Kevin Shum, Wappingers Falls, NY (US); Hans-Werner Tast, Weil im Schoenbuch (DE); Michael Hemsley Wood, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 995 days.

(21) Appl. No.: 11/859,819

(22) Filed: Sep. 24, 2007

(65) Prior Publication Data

US 2009/0083569 A1    Mar. 26, 2009

(51) Int. Cl.
*G06F 1/04* (2006.01)

(52) U.S. Cl. ........................ 713/501; 365/233.1; 714/733
(58) Field of Classification Search ............... 365/233.1; 714/733; 713/501
See application file for complete search history.

(56) References Cited

U.S. PATENT DOCUMENTS

| | | | | |
|---|---|---|---|---|
| 5,256,912 | A | * | 10/1993 | Rios .............................. 327/144 |
| 6,442,722 | B1 | * | 8/2002 | Nadeau-Dostie et al. ..... 714/731 |
| 7,518,947 | B2 | * | 4/2009 | Starnes ..................... 365/233.11 |

* cited by examiner

*Primary Examiner* — Albert Wang
(74) *Attorney, Agent, or Firm* — John E. Campbell; Michael Buchenhorner (57) ABSTRACT

A method for generating a local clock domain within an operation includes steps of: receiving a clock frequency measurement for a slow portion of logic within the operation; generating a local signal to indicate commencement of the operation and to function as a clock gating signal; latching the clock gating signal to a selected cycle; generating clock domain controls based on the clock gating signal such that the operation times itscommencement on the selected cycle; and propagating the clock gating signal in ungated latches for a number of cycles, such that a second operation is restricted from being launched until the operation completes.

20 Claims, 9 Drawing Sheets

| FIG.5a(a) | FIG.5a(b) |

GENERATING A LOCAL CLOCK DOMAIN USING DYNAMIC CONTROLS

CROSS-REFERENCE TO RELATED APPLICATIONS

None.

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to semiconductor devices and more particularly to generating a local clock domain.

2. Description of Background

When running a microprocessor at fast speeds some elements need to run slower than the main processor clock. In fact, large array accesses can take several clock cycles, increasing latency. The current solution to this problem is to send a global signal that acts as a hold signal. The slower element then ignores some of the clock pulses so that a longer time is available. Using a global signal means that the longer cycle times are always at a fixed relationship with this global signal, which means that sometimes cycles are wasted waiting for the global signal.

The current practice is to emit a signal that is used to gate the clock. For example, one signal is propagated throughout the chip. This signal causes the local clock to ignore every other clock cycle. This allows areas of the logic to work at half the frequency of the clock. Similarly, other signals can be sent out to divide the frequency by any integer number.

These gating signals are created globally so that all areas of the chip on a slower frequency work in phase with each other. This has implications for signals that cross the interface between the various clock domains. When a signal from the high frequency area wants to generate an action in a low frequency area, additional latency will occur some of the time. For example, if a signal in the high frequency portion of the logic wants to communicate with logic that is being clocked at one-third of the frequency an average of one cycle is spent at the interface. This comes about when the high frequency request is in phase with the slower frequency; therefore no latency is necessary. Were the high frequency request to come one cycle later, two cycles of latency are necessary to bring the two clock domains in phase. For truly asynchronous operation each of these events is equally likely so there is an average of one full cycle of latency (a min of zero and a max of two).

SUMMARY OF THE INVENTION

The shortcomings of the prior art are overcome and additional advantages are provided through the provision of a system and method for generating a local clock signal to eliminate access latency due to the timing mismatch between higher frequency and lower frequency signals.

Briefly, according to an embodiment of the invention, a method for generating a local clock domain within an operation includes steps of: receiving a clock frequency measurement for a slow portion of logic within the operation; generating a local signal to indicate commencement of the operation and to function as a clock gating signal; latching the clock gating signal to a selected cycle; generating clock domain controls based on the clock gating signal such that the operation times its commencement on the selected cycle; and propagating the clock gating signal throughout ungated latches for a number of cycles, such that a second operation is restricted from being launched until the operation completes.

According to another embodiment of the present invention, a logic region of an electronic circuit includes: a high frequency portion of the logic region; a low frequency portion of the logic region; a local signal to indicate commencement of a logic operation and to function as a clock gating signal; gated latches; ungated latches for propagating the clock gating signal; and clock domain controls based on the clock gating signal.

Additional features and advantages are realized through the techniques of the present invention. Other embodiments and aspects of the invention are described in detail herein and are considered a part of the claimed invention. For a better understanding of the invention with advantages and features, refer to the description and to the drawings.

Technical Effects

As a result of the summarized invention, technically we have achieved a solution which removes the latency cycles associated with crossing the clock domain boundary.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 5b is a flow chart of the method for array access shown in FIG. 5a;

The detailed description explains the preferred embodiments of the invention, together with advantages and features, by way of example with reference to the drawings.

DETAILED DESCRIPTION OF THE INVENTION

We describe a solution to the shortcomings of the prior art, using dynamically generated local controls to enable a longer clock cycle to begin on any arbitrary clock cycle that is useful.

In contrast to relying on a global clock signal (based on the main processor clock), dynamically generating local clock controls enables a slower frequency operation to be started at any arbitrary time. This completely removes the latency cycles associated with crossing the clock domain boundary. Additionally, we prevent multiple operations from being launched during the same low frequency clock pulses.

Figure 1:
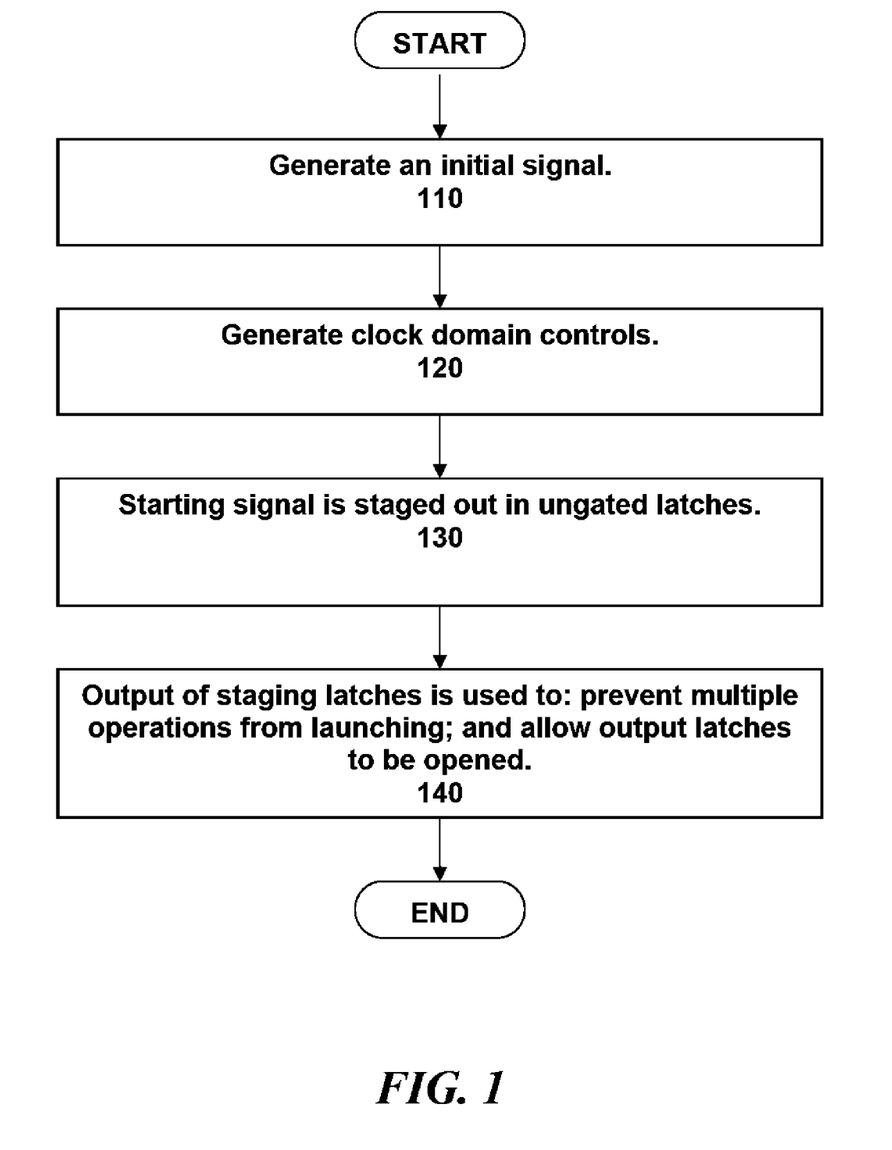
FIG. 1 shows a flow chart of the process for generating a local clock domain, according to an embodiment of the present invention.

Referring to FIG. 1 there is shown a flow chart of the process for generating a local clock domain, according to an embodiment of the present invention. The first step 110 is to generate an initial signal (this will usually be a logic control signal) to indicate that an operation should commence on a particular cycle. This particular cycle may be selected based upon local environmental parameters. Alternatively, for testing purposes, cycles may be selected at random.

In step 120, using this initial, or start signal, we generate clock domain controls so that the operation can properly time starting on this selected cycle. Typical Local Clock Blocks (LCBs) have logic control signals that turn clocks on/off. So the signal that is used to start the logical activity is used as an LCB control to turn the clocks in the local clock domain on.

In step 130 the starting signal is staged out (propagated) throughout the ungated latches for a number of cycles. The number of cycles is determined by how slow a frequency is used. The slow frequency is determined by the frequency requirements of the slower section of logic (slower than the main processor clock). If the slower portion of logic takes twice as long as the normal clock frequency, then a two to one (2:1) ratio is used. This decision is driven by the internal working of this slower logic.

In step 140 the output of all of the staging latches is used in two distinct ways. The first is to prevent a second operation from being launched until the current operation is complete. The second is to allow the output latches to be opened to capture the correct result.

There are additional testability improvements that are enabled by this method. In one embodiment, the logic self test operation is selected as the start cycle. By forcing an operation to commence when logic self test begins, a known result can be captured even if the apparent test clocks only last one clock grid cycle. This invention allows the slower portion of logic to complete after the normal test clocks are turned off. This means that latches in this local domain always have known testability states.

Figure 2:
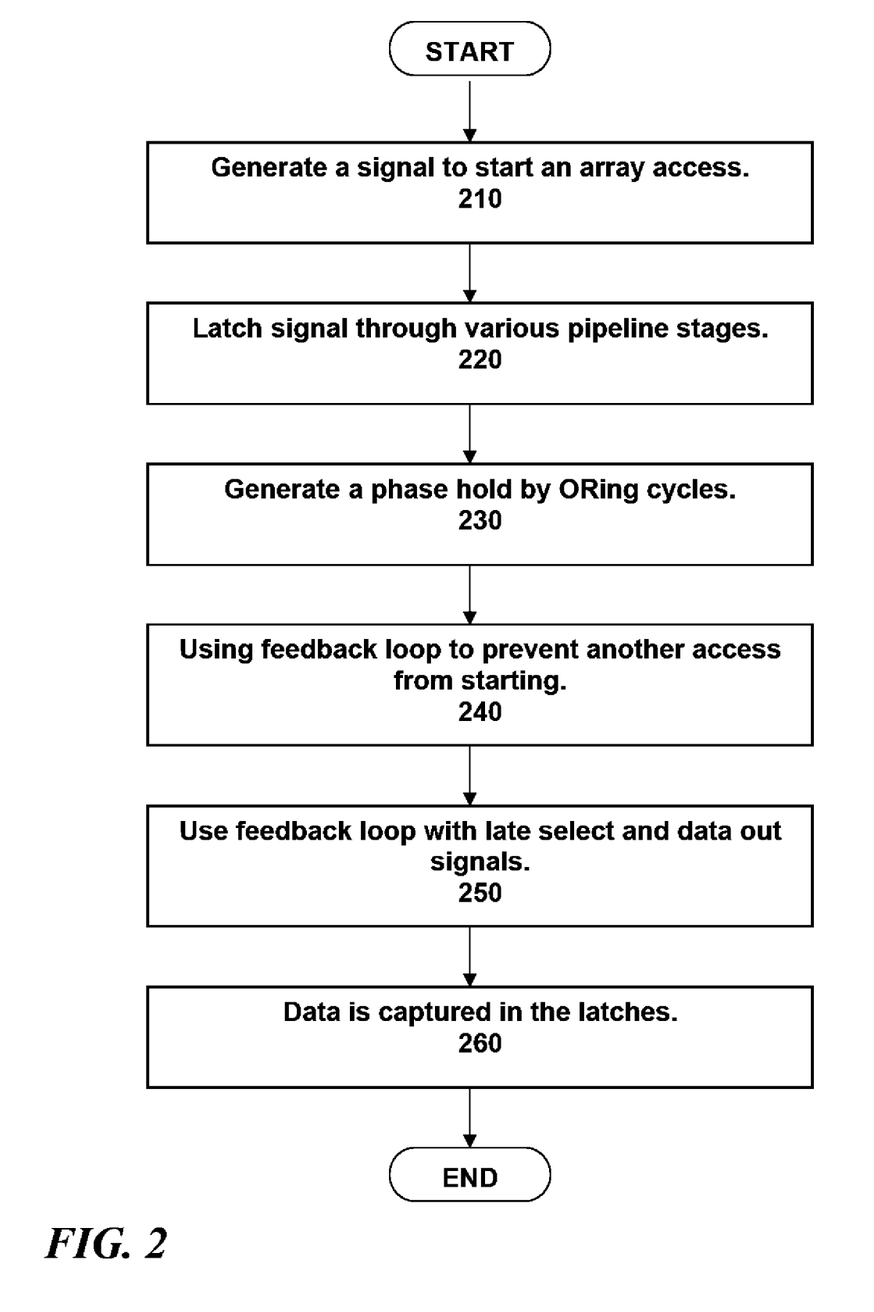
FIG. 2 shows a flow chart of the process for generating a local domain for an array, according to another embodiment of the present invention.

Referring to FIG. 2 there is shown a flow chart of another embodiment of the present invention dealing with array access. In step 210 a signal commences an array access. In step 220 the signal is latched through various pipeline stages. A phase hold is generated in step 230 by ORing the last n cycles. This phase hold is used to prevent the clocks from switching for n cycles. In step 240, a feedback loop also prevents another access from starting until the current access is finished. The same idea is extended to the late select signals and the data out signals in step 250. The gating of the data out signals means that data is captured in the latches in step 260 only when a cache access is initiated which leads to a testability enhancement.

This method has the additional advantages that the addresses and other control inputs (wrt_en, bw, . . . ) are held stable for multiple cycles during the access, and no other arysel (array select) signal can go high for four cycles. This is also true in the array lcb (local clock buffer). The late_select signals can be held stable during the last part of the access.

At clock startup arysel is guaranteed to go high (when the global clock gate enables the clocks); this guarantees the outputs of the SRAM (static random access memory) taking a stable non-X value during LBIST (logic built-in self test). Any multiple cycle LBIST run also guarantees that any array access will be a complete access even if LBIST ends before the cycle required to finish an array access.

The staging plats have a gptr (get pointer) control that allows them to be disabled for extremely slow operations (makes the access a 2 cycle path), which enables 2 g LBIST at a slower frequency.

The power gating out at the cache macro for addresses, datain, lalte select and data out—are all triggered by arysel. For the array inputs the arysel works as hold after arysel, therefore we need an additional local clock gate. For all later latches (lsal, dout) the arysel works as a trigger making a separate lcl_clk_gate unnecessary.

All outputs that go to the array have a full cycle to get to the array (datain/address/arysel/arysel_do_.

The phase hold logic prevents multiple array accesses within four cycles which is important for LBIST, since the functional logic might be scanned into a state (per pseudo random pattern generator "PRPG") where it launches multiple array accesses back to back in sequence. Also, holding the clocks during the array access rather than just having a hold-loop around the address mux (multiplexer) makes sure that in LBIST, the addresses are held stable during the array access. Additionally, the SRAM output latch is controlled by a private "global clock enable" (glb_clk_gate_b). This is needed to ensure that during LBIST no undetermined states (X's) remain in the output latch. During the SRAM access the SRAM output first goes into X-state, and if the clocks are turned off again the output latch captures those X's. Then when the stable SRAM output is available those X's would not be overwritten. By extending the "global clock enable" specifically for those output latches, the clock at these latches stays on long enough to overwrite the X's with the stable SRAM output.

Figure 3:
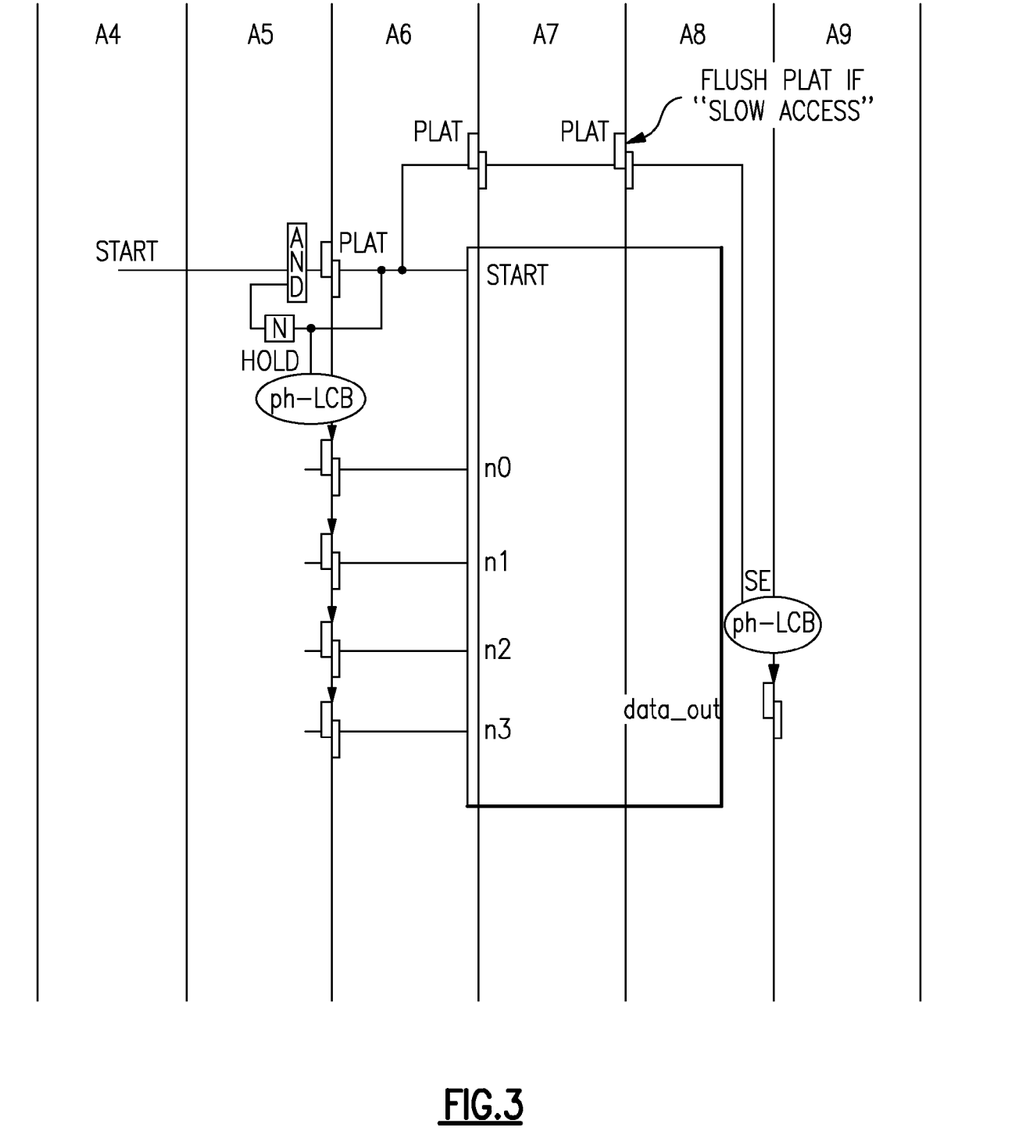
FIG. 3 illustrates one example of the invention where the local clock domain is running at one-half the frequency of the main clock.

Returning to the drawings in greater detail, it will be seen that in FIG. 3 there is shown an embodiment of the present invention with a schematic description of what happens for a block that will use two clock cycles to perform one operation. This provides the details of all of the latches and controls that are required to implement this simplest embodiment.

In the upper right-hand corner there is a signal name start that begins the operation. It comes in and is ANDed with the NOT of the previous cycle. This is the mechanism that prevents two operations from being started within the same 2:1 clock domain. A second operation is not allowed to begin until the first operation has completed.

The output of this goes into a plat. A plat is a latch that is free running with the grid clock and has no allowed clock gating. The lack of clock gating here is important so that the start condition will be guaranteed to clear out on the subsequent cycle. This plat then feeds back into the AND as described above. The output of this plat also drives the hold signal for the local clock blocks (LCBs) that contain all of the data that the slower block is dependent upon. During the 2:1 operation these latches are forced to keep the original data for the entire 2 cycle operation.

The initial plat also feeds the start indication on the block that is running at a slower frequency as well as a chain of plats that eventually allow the output latches to receive new data. This is delayed by two plats because the block itself takes two cycles to execute. Until the new result is available the output latches continue to have the previous result available.

Figure 4:
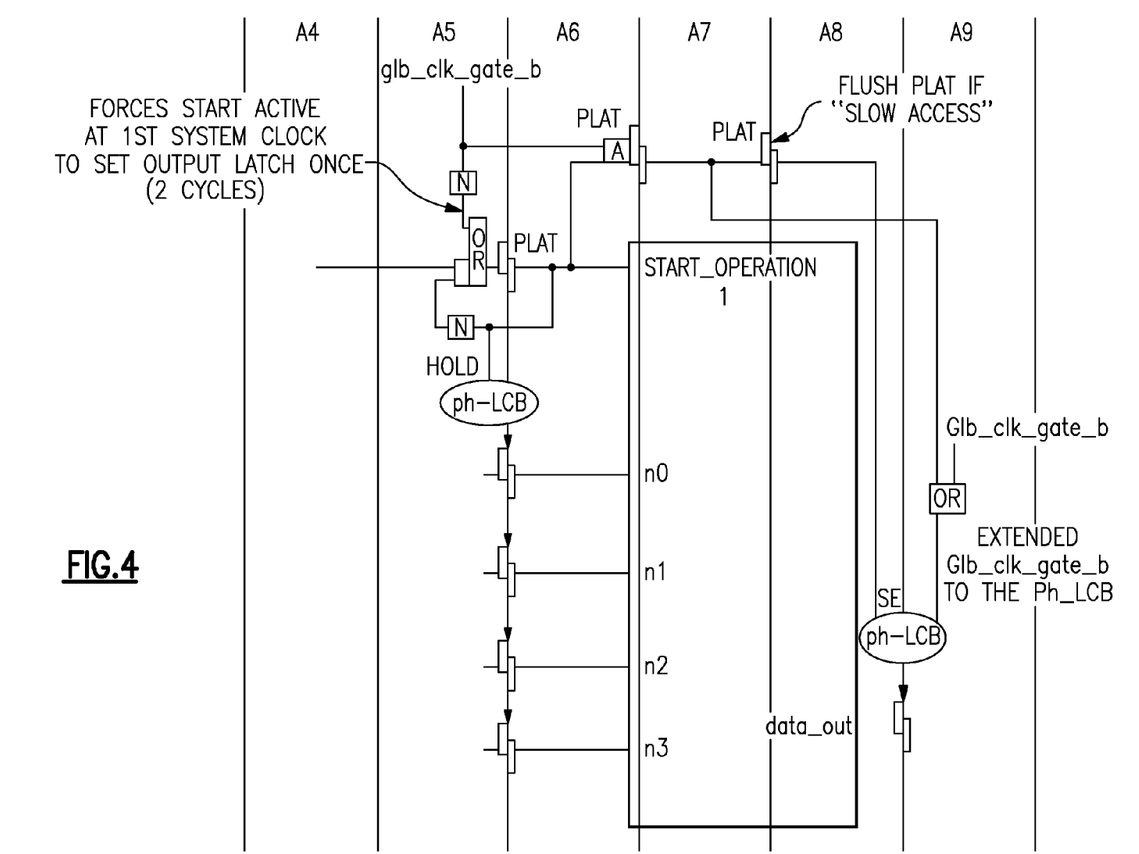
FIG. 4 illustrates how the invention is extended to improve testability with self test structures.

The structure described in FIG. 3 can be modified to improve testability during self-test. These modifications are shown in FIG. 4. The primary additional feature is that the global clock gate is ORed with the start signal. This is done to guarantee that an operation is initiated at the beginning of self-test.

The staged out version of this global clock gate is used on the local clock block that controls the output latches. This is to guarantee a known state at the end of a self-test sequence. If the clocks were turned off with the normal usage of global clock gate the output latches would have unknown states since the area of slower logic would only be through a portion of the time allotted to its operation.

Figure 5A:
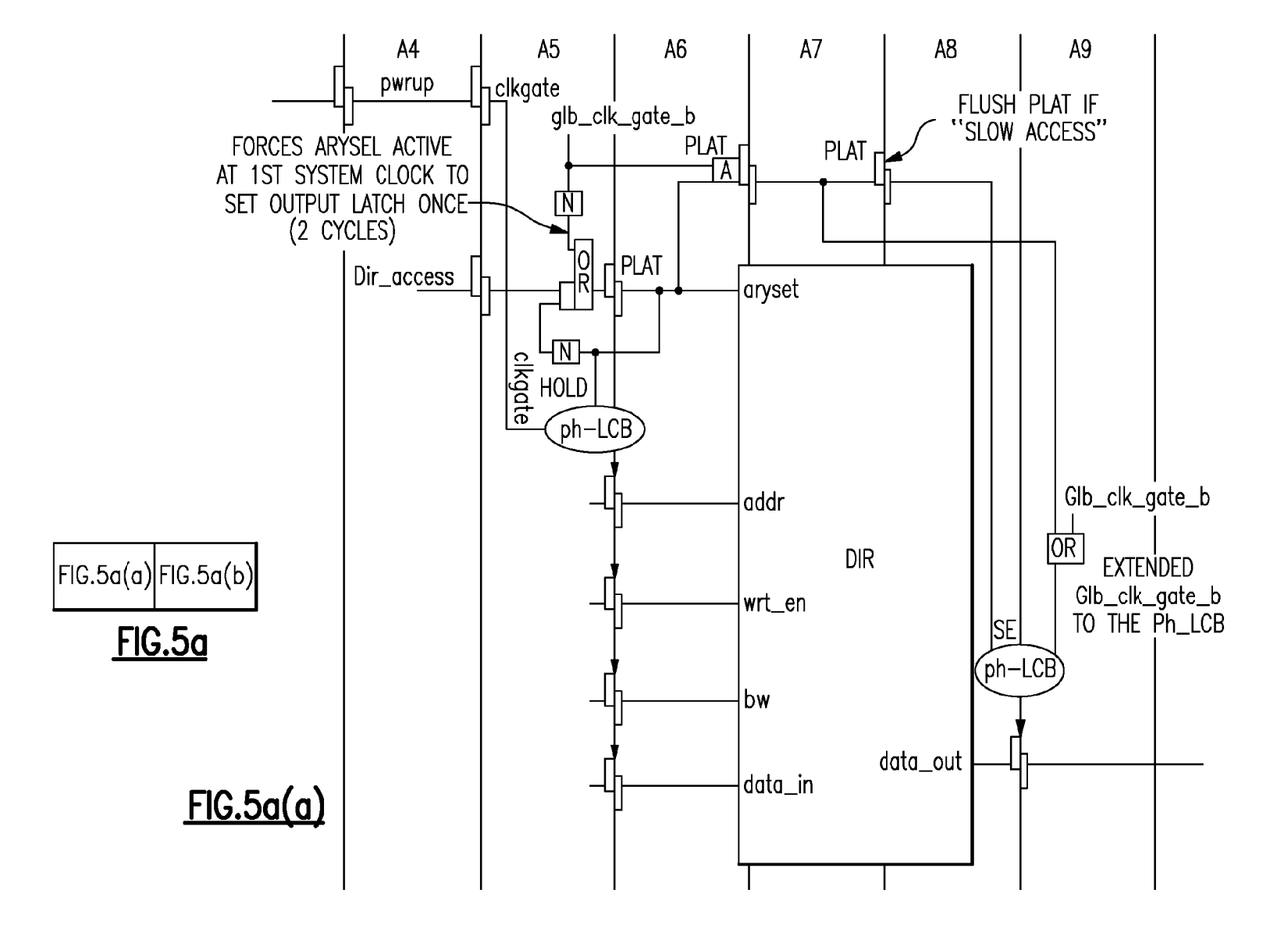
FIG. 5a illustrates one example of an array access that uses this invention for a 2 cycle access.
Figure 5B:
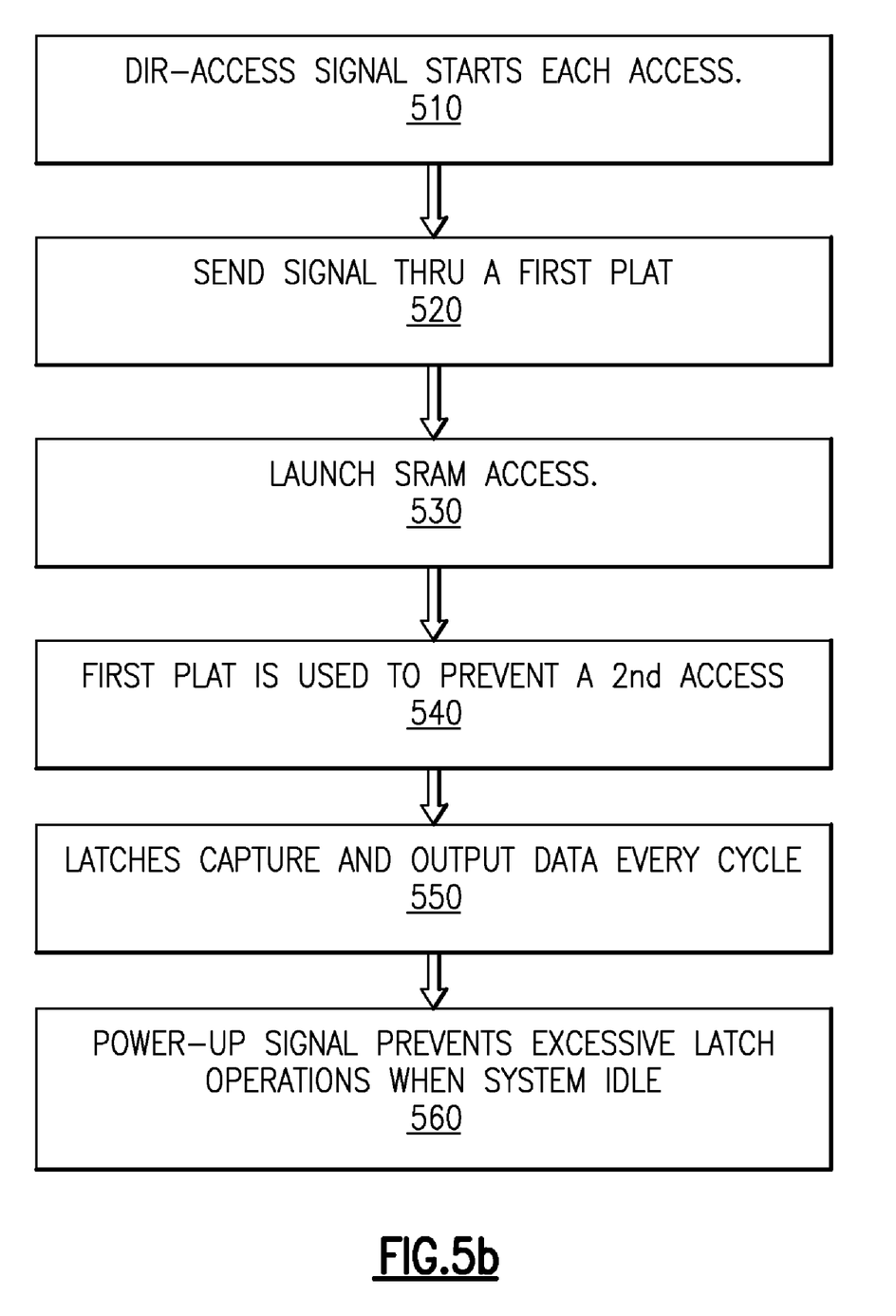

Referring to FIG. 5a there is shown an embodiment of the present invention wherein a cache directory SRAM requires two cycles for a read or a write access. FIG. 5b is a flow chart detailing the process shown in FIG. 5a. In step 510 each access is started by asserting the "dir_access" signal. Next, in step 520, this signal is sent through a first plat and then in step 530 the signal launches the SRAM access through the SRAM arysel input.

In step 540, the first plat is also used to prevent a second access to the SRAM to be triggered in the immediately following cycle, since the SRAM itself needs two cycles for each access. Even if the functional logic does not assert the "dir_access" in two consecutive cycles, during self-test such a situation would be possible, and this must be prevented by means of the first plat feeding back. Other inputs into the SRAM are address, write enable (wrt_en), bit-write enables (bw), and data input (data_in). Before an access to the SRAM starts, in step 550 these latches are allowed to capture and output new data every cycle.

For power saving, an additional power-up signal (pwrup/clkgate) is used to prevent excessive latch operations when the system is idle in step 560. When a SRAM access is to begin, the dir access signal will be asserted, and together with the dir-access the accompanying inputs (addr, wrt_en, bw, data_in) will be captured into the corresponding latches, then driven into the SRAM together with the arysel that launches the SRAM access. Since the SRAM needs to see stable inputs on the addr, wrt_en, bw, and data_in inputs on its second access cycle, the first plat will be used to block the latches from a new capture/output sequence on the second cycle. The latches will therefore hold their content and output stable for the second cycle such that the SRAM can cleanly finish its 2-cycle access.

Also shown in FIG. 5a is the output capturing logic of the 2-cycle SRAM access. A second plat is used to delay the arysel by one cycle, and a third plat is used to delay the arysel by one more cycle. Also shown is the latch that captures the data_out output of the SRAM. This latch is by default not allowed to capture the SRAM output because it is normally in an invalid logical state. Only exactly two cycles after the SRAM was launched with the first plat's arysel is the output in a valid state. Therefore, in this embodiment, the third plat's output is used to allow the latch to capture the SRAM output in the exact right cycle only.

The testability extensions are also shown in FIG. 5a. The global clock-control glb_clk_gate_b is used to force the primary arysel active while the clocks are stopped. At the same time this signal is used to prevent the second and third plat from becoming active and thus prevent premature clocking of the output latch. As soon as the clocks are turned on (by lowering glb_clk_gate_b) a SRAM access will start, and the chain of plats will allow the output latch to capture the SRAM output in the exact right cycle. If the clocks would be turned on for only a single cycle (which is often done for logic self test), the output latch would already be deactivated by means of glb_clk_gate_b before the SRAM access finishes with a valid output signal. This would leave an invalid result in the output latch; therefore the glb_clk_gate_b is extended by means of the OR-gate and the second plat's output to allow the output latch to capture output results as long as the SRAM access is still pending.

Figure 6:
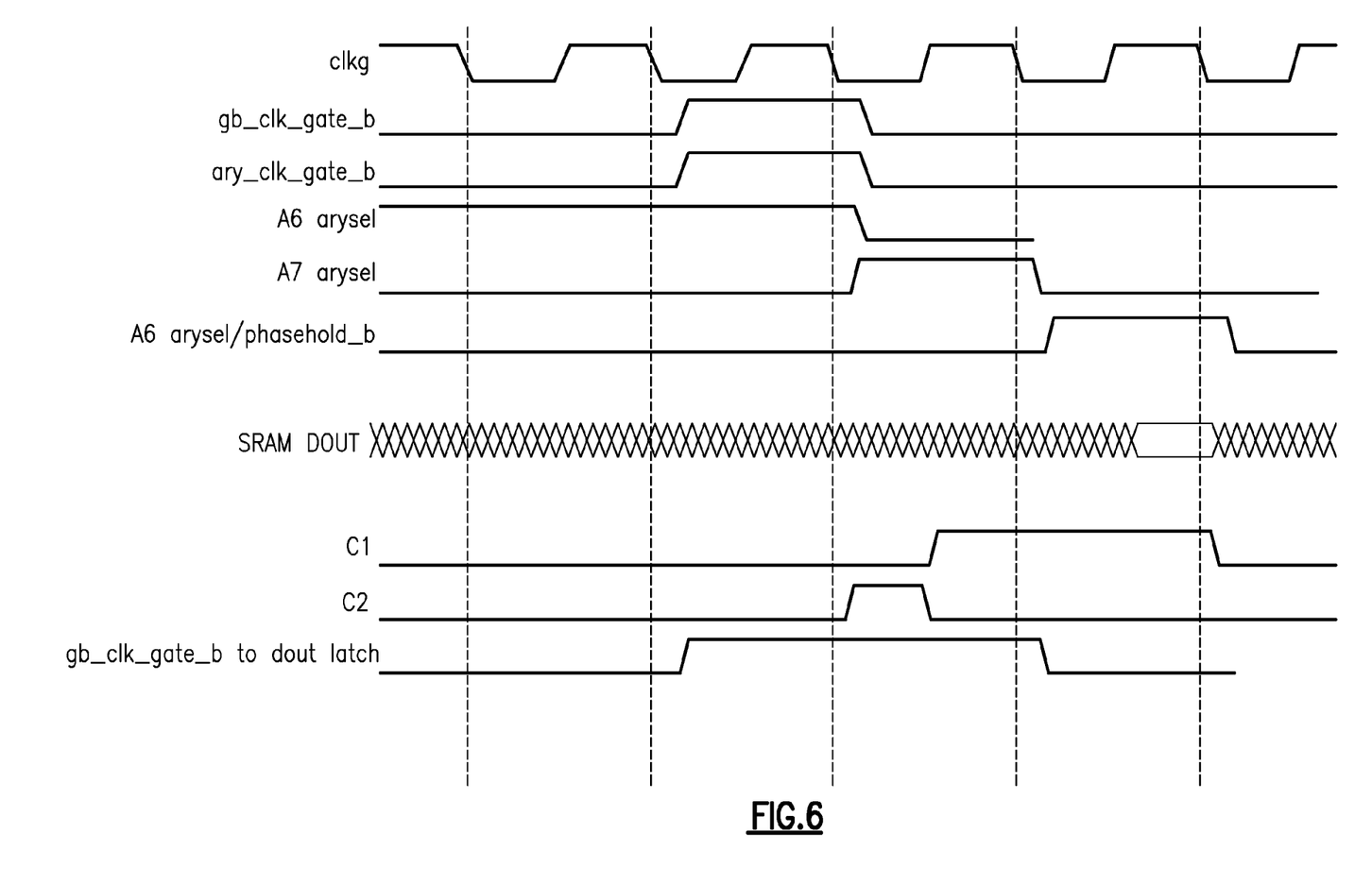
FIG. 6 illustrates one example of an array access that uses this invention to perform a 4 cycle access with late select coming on in the third cycle.

FIG. 6 depicts the resulting timing chart for an access with a single cycle active clock.

The third plat can be turned into a "transparent mode" where it does not further delay the second plat's output by one cycle. This is useful for testing the SRAM at a slower frequency as a single-cycle access.

Figure 7:
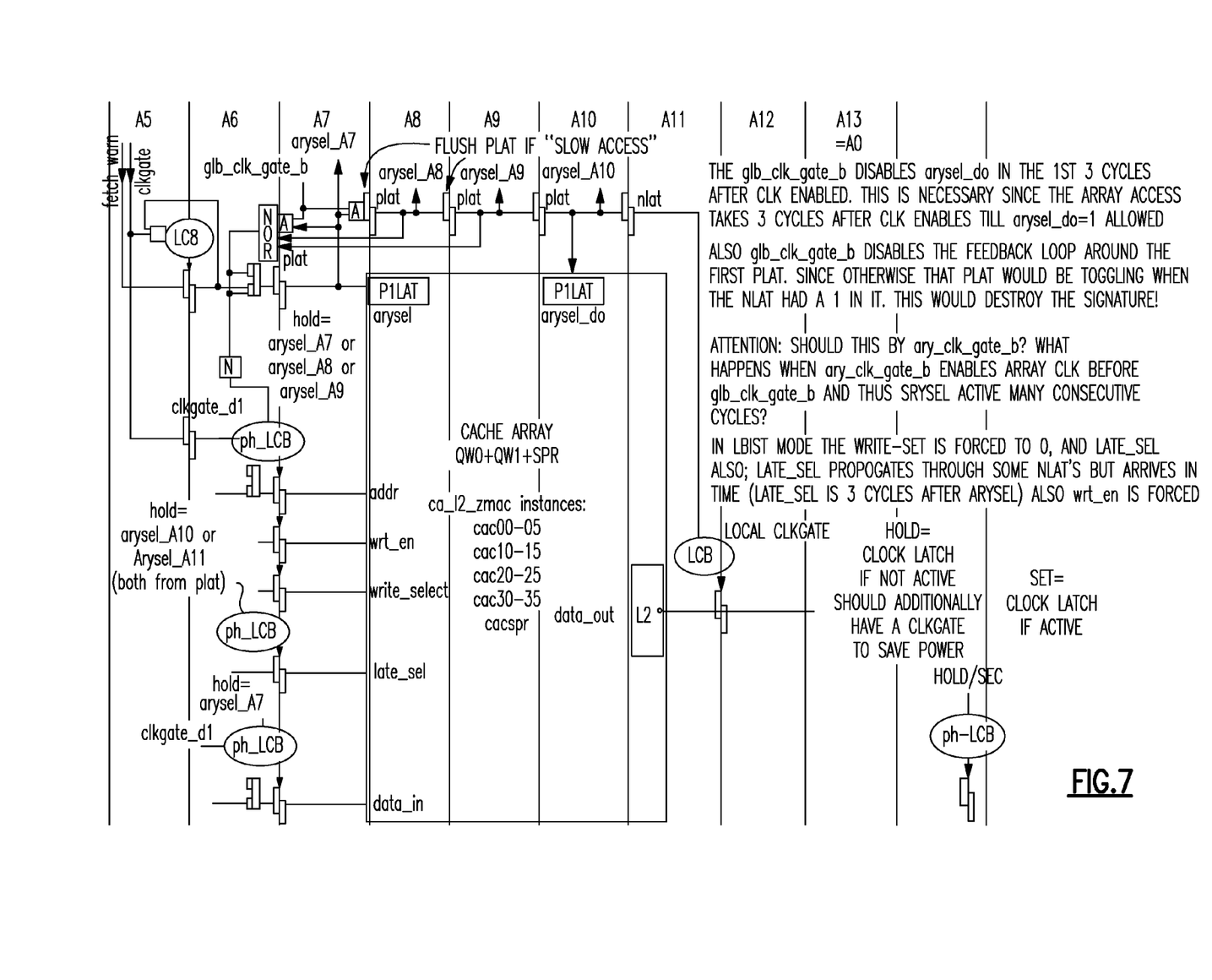
FIG. 7 illustrates one example of an array access using an OR of the first, second, and third plat, according to an embodiment of the present invention.

Another embodiment with a 4-cycle SRAM access is shown in FIG. 7. When the signal a5_arysel_q activates, it sets the first plat which then starts the SRAM access by asserting the arysel input of the SRAM. A chain of a second and third plat further delay this arysel, and the OR of the first, second, and third plat outputs are used to prevent another arysel to the SRAM within the next 3 cycles after the original arysel. This ensures that the SRAM can perform its 4-cycles access. A fourth plat is used to delay the arysel by yet another cycle, and the resulting output is used to generate a local clock for the SRAM-internal output latch (L2*). In that way, the L2* output latch only activates exactly three cycles after the primary arysel started the SRAM access. The next external latch capturing the SRAM output is a normal latch that is only clock-gated for power-saving.

In the embodiment of FIG. 7, the input latches for address (addr), write enable (wrt_en), and write select (write_select) are held for three cycles as soon as the primary arysel starts the SRAM access. This is done by using the 'OR' of the first, second, and third plat for preventing those latches from clocking. The other input latches late_sel and data_in only need to be held to respectively one cycle and therefore only use the first and second plats, respectively, for preventing the clocking.

For testability extensions, glb_clk_gate_b, glb_clk_gate_b is used to prevent a toggling first plat while the clocks are not enabled, and is also used to prevent the second, third, and fourth plat from becoming logical '1' in order to prevent a premature clocking of the L2* output latch.

The capabilities of the present invention can be implemented in software, firmware, hardware or some combination thereof. As one example, one or more aspects of the present invention can be included in an article of manufacture (e.g., one or more computer program products) having, for instance, computer usable media. The media has tangibly embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

We claim:

1. A method for generating a local clock domain within an operation, the method comprising steps of:
   receiving a clock frequency measurement for a slower region of logic within the operation, wherein the slower region of logic is slower than a main processor clock;
   generating a local signal to indicate commencement of the operation and to function as a clock gating signal;
   latching the clock gating signal to a selected cycle based on the clock frequency measurement;
   generating clock domain controls based on the clock gating signal such that the operation times its commencement on the selected cycle; and
   propagating the clock gating signal throughout ungated latches for a number of cycles, such that a second operation is restricted from being launched until the operation completes.

2. The method of claim 1, wherein latching the clock gating signal comprises generating a phase hold by ORing additional cycles.

3. The method of claim 1, further comprising: generating an additional power-up signal to prevent excessive latch operations when the system is idle, for reducing power consumption.

4. The method of claim 1 wherein a feedback loop is used on the selected cycle to prevent the second operation from launching.

5. The method of claim 1 further comprising steps of:
   preventing addresses and other control inputs for multiple cycles from launching during an access;
   restricting other array select signals from going high for four cycles; and holding late_select signals during a last part of the operation.

6. The method of claim 5 further comprising a step of:
   using the clock gating signal to block clocks associated with latches that feed a slower clock domain.

7. The method of claim 6 further comprising a step of:
   using the clock gating signal to ungate clocks associated with output data of the slower region of logic.

8. The method of claim 5 further comprising a step of:
   using the clock gating signal to block additional start indications from being used.

9. The method of claim 5 further comprising a step of:
   forcing commencement of a slow operation using a global clock gate for test.

10. The method of claim 5 further comprising a step of:
    allowing the clock gating signal to continue after a global clock gate has returned to a non-test indication.

11. The method of claim 1 wherein the step of latching the clock gating signal further comprises:
    commencing on the selected cycle that is useful based upon local environmental parameters.

12. The method of claim 1 further comprising a step of allowing output latches to be opened to capture a correct result.

13. The method of claim 1 wherein the selected cycle is a logic self test operation.

14. The method of claim 13 further comprising ORing a global clock gate with the local clock signal.

15. A computer program product tangibly embodied on a non-transitory computer readable medium and comprising code that, when executed, causes a computer to perform the following:
    receiving a clock frequency measurement for a slower region of logic within the operation, said slower region of logic being slower than a main processor clock;
    generating a local signal to indicate commencement of the operation and to function as a clock gating signal;
    latching the clock gating signal to a selected cycle;
    generating clock domain controls based on the clock gating signal such that the operation times its commencement on the selected cycle; and propagating the clock gating signal in ungated latches for a number of cycles, such that a second operation is restricted from being launched until the operation completes.

16. The computer program product of claim 15 wherein the selected cycle is a logic self test operation.

17. The computer program product of claim 16 wherein the code further causes the processor to OR a global clock gate with the local clock signal.

18. A logic region of an electronic circuit, the logic region comprising:
    a high frequency portion of the logic region;
    a low frequency portion of the logic region;
    a local signal to indicate commencement of a logic operation on a selected cycle and to function as a clock gating signal;
    gated latches;
    ungated latches for propagating the clock gating signal; and
    clock domain controls based on the clock gating signal.

19. The logic subsystem of claim 18 wherein the selected cycle is a logic self test operation.

20. The logic subsystem of claim 18 further comprising an additional power-up signal to prevent excessive latch operations when the system is idle.

* * * * *